United States Patent
Chalamala et al.

(10) Patent No.: US 8,736,385 B2
(45) Date of Patent: May 27, 2014

(54) RING OSCILLATOR BASED VOLTAGE CONTROL OSCILLATOR HAVING LOW-JITTER AND WIDE BANDWIDTH

(75) Inventors: Sreenivasa Chalamala, Dresden (DE); Dieter Hartung, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 46 days.

(21) Appl. No.: 13/192,324

(22) Filed: Jul. 27, 2011

(65) Prior Publication Data

US 2013/0027139 A1 Jan. 31, 2013

(51) Int. Cl.
*H03L 7/099* (2006.01)
*H03L 7/10* (2006.01)
*H03K 3/03* (2006.01)

(52) U.S. Cl.
CPC ............... *H03L 7/0995* (2013.01); *H03L 7/10* (2013.01); *H03K 3/0322* (2013.01)
USPC .................. 331/57; 331/17; 331/34; 331/16; 331/179

(58) Field of Classification Search
USPC .................................. 331/57, 179, 17, 16, 34
See application file for complete search history.

(56) References Cited

U.S. PATENT DOCUMENTS

| | | | |
|---|---|---|---|
| 5,903,195 A * | 5/1999 | Lukes et al. | 331/4 |
| 6,072,372 A * | 6/2000 | Yokoyama | 331/57 |
| 6,175,282 B1 * | 1/2001 | Yasuda | 331/44 |
| 6,489,821 B1 * | 12/2002 | Kurd et al. | 327/157 |
| 7,061,334 B1 * | 6/2006 | Baig et al. | 331/57 |
| 7,301,413 B2 * | 11/2007 | Sekimoto | 331/179 |
| 7,948,330 B2 * | 5/2011 | Seo et al. | 331/186 |
| 7,956,695 B1 * | 6/2011 | Ding et al. | 331/17 |
| 2007/0236298 A1 * | 10/2007 | Yamaguchi et al. | 331/57 |
| 2009/0085654 A1 * | 4/2009 | Lin | 327/543 |
| 2011/0316639 A1 * | 12/2011 | Fischette | 331/183 |

* cited by examiner

*Primary Examiner* — Ryan Johnson
(74) *Attorney, Agent, or Firm* — Ingrassia Fisher & Lorenz, P.C.

(57) ABSTRACT

The embodiments described herein provide a voltage controlled oscillator (VCO). The VCO may include, but is not limited to a voltage-to-current converter configured to receive a control voltage and to convert the control voltage to a current, a current bias circuit coupled to the voltage-to-current converter and configured to receive frequency band select digital inputs and to bias the current generated by the voltage-to-current converter based upon the band select inputs, and a ring oscillator coupled to receive the biased current and to output an oscillating signal based upon the biased current.

16 Claims, 5 Drawing Sheets

300

400

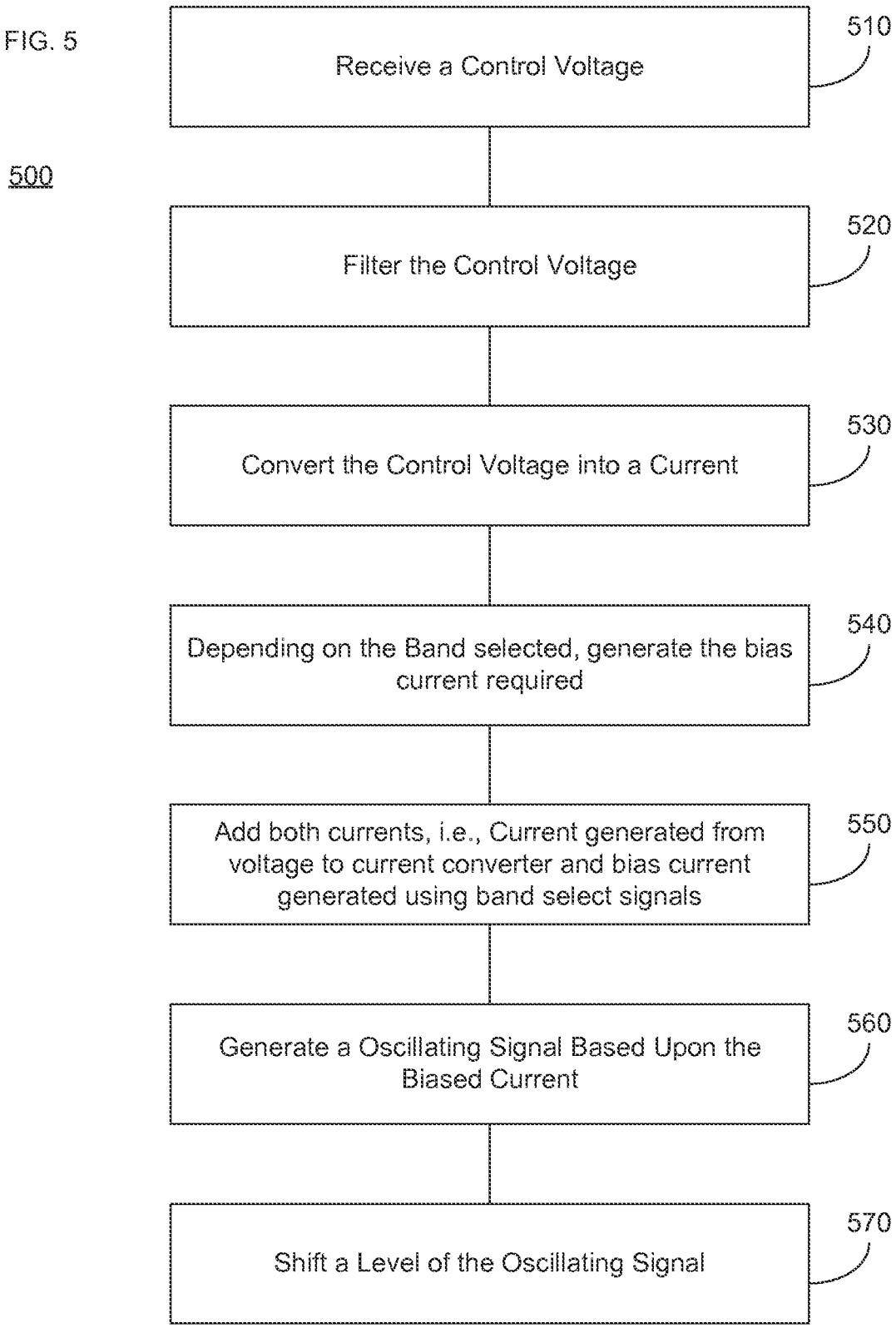

RING OSCILLATOR BASED VOLTAGE CONTROL OSCILLATOR HAVING LOW-JITTER AND WIDE BANDWIDTH

FIELD OF THE INVENTION

This invention generally relates to voltage controlled oscillators, and more particularly to ring oscillator based voltage control oscillators.

BACKGROUND OF THE INVENTION

A voltage-controlled oscillator (VCO) is an electronic oscillator designed to be controlled in oscillation frequency by a voltage input. VCOs may be used as clock generators for processors, in function generators, phase-locked loops, frequency synthesizers used in communication equipment, and in many other clocking applications. Typical ring oscillator based VCOs have a wide frequency tuning range by utilizing a high gain voltage-to-current converter. However, because of the high gain, any noise on control voltage is also amplified causing jitter or phase noise. Other VCOs may utilize inductors and capacitors to create the oscillating signal and may be referred to as LC VCOs. The LC VCOs utilize capacitor banks to increase the frequency range of the LC VCO. In contrast to ring oscillator based VCOs, LC VCOs have low jitter or phase noise. However, LC VCOs require a larger area, use more power, may require off-chip inductors, and can only achieve a wide frequency range by using large capacitor banks.

BRIEF SUMMARY OF THE INVENTION

In one exemplary embodiment, a voltage controlled oscillator (VCO) is provided. The VCO may include, but is not limited to a voltage-to-current converter configured to receive a control voltage and to convert the control voltage to a current, a current bias circuit coupled to the voltage-to-current converter and configured to receive a digital code and to bias the current generated by the voltage-to-current converter based upon the digital code, and a ring oscillator coupled to receive the biased current and to output an oscillating signal based upon the biased current.

In another exemplary embodiment, a processor is provided. The processor may include, but is not limited to, a loop filter configured to receive a control voltage and to filter noise from the control voltage, a voltage-to-current converter coupled to the loop filter and configured to receive the filtered control voltage and to convert the filtered control voltage to a current, a current bias circuit coupled to the voltage-to-current converter and configured to bias the current generated by the voltage-to-current converter, and a current starved differential ring oscillator coupled to the voltage-to-current converter and configured to receive the biased current and to generate an oscillating signal based upon the biased current.

In yet another exemplary embodiment, a method for producing a voltage controlled oscillating signal using a ring oscillator is provided. The method may include, but is not limited to, receiving a control voltage, converting the control voltage to a current, pre-determining a frequency band where the ring oscillator will be outputting the oscillating signal, adding a bias to the current based upon the predetermined frequency band, and generating the oscillating signal based upon the biased current.

BRIEF DESCRIPTION OF DRAWINGS

Exemplary embodiments will hereinafter be described in conjunction with the appended drawings, where like designations denote like elements.

FIG. 5 illustrates a method for generating a voltage controlled oscillating signal using a VCO in accordance with an embodiment.

DETAILED DESCRIPTION OF THE DRAWINGS

The following detailed description is merely exemplary in nature and is not intended to limit the embodiments or the application and uses of the embodiments. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. In addition, certain terminology may also be used in the following description for the purpose of reference only, and thus is not intended to be limiting. The terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

Figure 1:
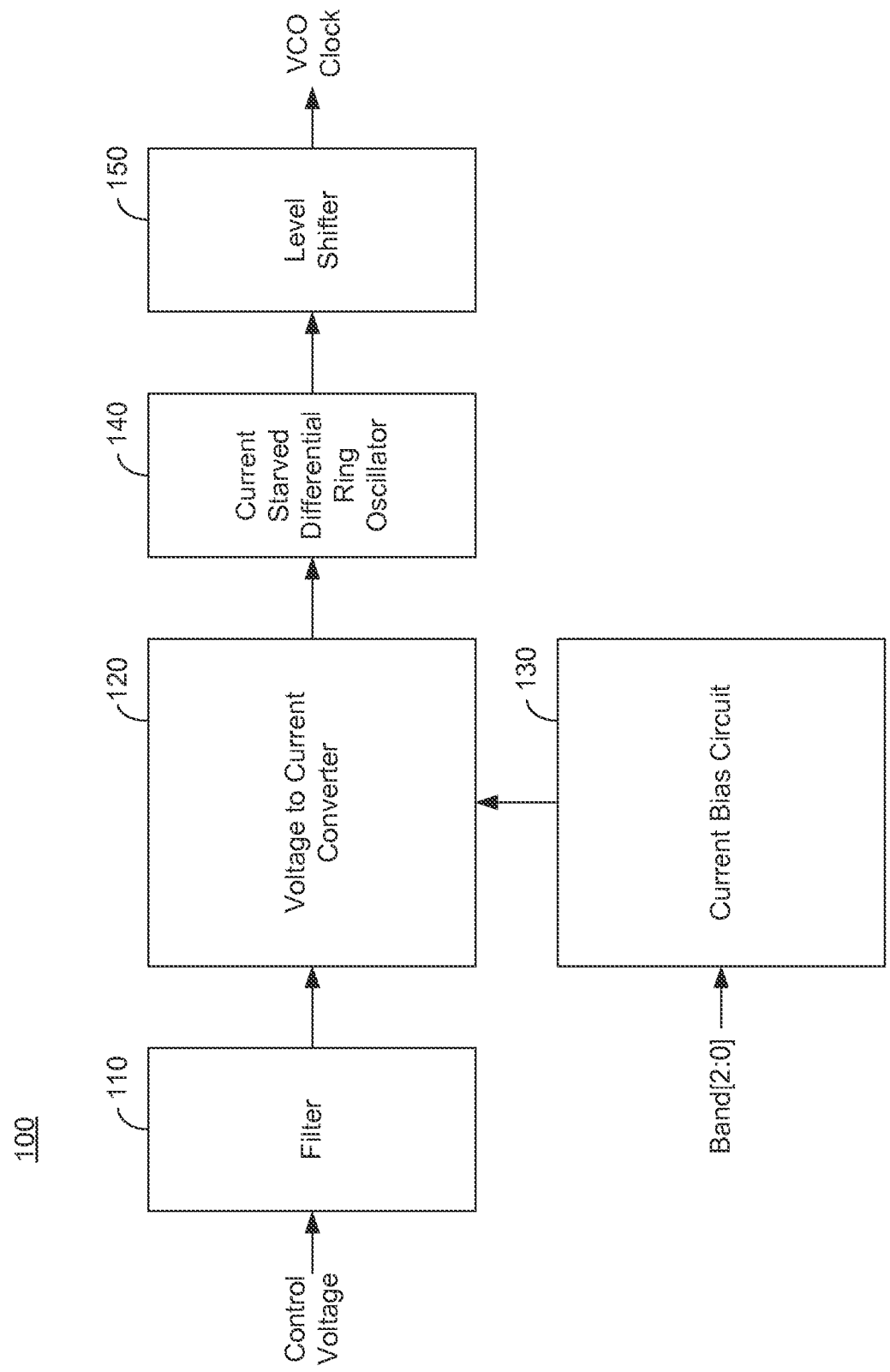
FIG. 1 is a block diagram of an exemplary low jitter wideband ring oscillator based voltage controlled oscillator (VCO) in accordance with an embodiment.

FIG. 1 is a block diagram of an exemplary low jitter wideband ring oscillator based voltage controlled oscillator (VCO) 100 in accordance with an embodiment. The VCO 100 can be used in any clocking application. In one embodiment, for example, the VCO 100 may be used by a phase lock loop (PLL). In other embodiments, for example, the VCO 100 may be used in a communications device. In still other embodiments, for example, the VCO can be used in a processor. The processor may be, for example, a microprocessor, a digital signal processor, an application specific integrated circuit, a field programmable gate array, a central processing unit, a graphical processing unit, or any other type of processor.

The VCO 100 includes a filter 110 which receives a control voltage and filters noise from the control voltage. The control voltage controls the frequency of the VCO output, as discussed in further detail below. The VCO 100 also includes a current bias circuit 130 which receives a frequency band select digital code that selects the frequency band, and generates a bias current based upon the digital code. The filter 110 and the -current bias circuit are coupled to a voltage-to-current converter 120. The voltage-to-current converter 120 receives the filtered control voltage from the filter 110 and converts the filtered control voltage into a current. The voltage-to-current converter 120 then modifies the current based upon the bias current generated by the current bias circuit 130, as discussed in further detail below. The voltage-to-current converter 120 is coupled to a current starved differential ring oscillator 140, which receives the biased current from the voltage-to-current converter 120 and outputs an oscillating signal based thereon. The current starved differential ring oscillator 140 is coupled to a level shifter 150 which receives the oscillating signal from the current starved differential ring oscillator 140 and converts it into a digital clock signal, as discussed in further detail below. The output of the level shifter 150 is a VCO clock which can be used in any device or application.

The filter 110 filters noise from a control voltage used to control the VCO 100. Noise in the control voltage results in jitter in the output oscillating signal. In one embodiment, for example, the filter 110 may be a loop filter which filters out noise from the control voltage. The type of filter used in the VCO 100 may depend upon the application or device using the VCO 100 and the type of noise typically experienced therein.

The voltage-to-current converter 120 converts the control voltage received from the filter 110 to a current. The current bias circuit 130 generates a current which is used to bias the current generated by the voltage-to-current converter 120. The biased current is used by the current starved differential ring oscillator 140 to generate the oscillating signal, as discussed in further detail below.

The current bias circuit 130 first receives a frequency band select digital code that gives frequency band of the oscillating signal to be output by the VCO 100. In one embodiment, for example, the current bias circuit 130 could have three current levels, each corresponding to one of three frequency bands. The digital code may be generated in a variety of ways, based upon how the VCO is being used. In one embodiment, for example, the digital code can be user programmable. In other embodiments, the digital code may be generated by the application or device using the VCO 100 based upon some control logic. For example, when the VCO 100 is being used in a PLL, the digital code may be based upon a voltage level of the control voltage, where some digital logic generates the digital code based upon the voltage of the control voltage. In another embodiment, for example, when the VCO 100 is being used to tune a radio, the digital code may be read from a known memory location on the system based upon which frequency spectrum (for example, High Frequency band (HF band), Very High Frequency band (VHF band), etc.) the radio is attempting to be tuned to. Similarly, when the VCO 100 is being used to step a CPU clock frequency, the digital code may be read from a register in the CPU.

In one embodiment, for example, each frequency band could cover a two gigahertz (GHz) range. Further, in one embodiment, for example, the frequency bands may overlap to ensure that there are no frequency gaps due to process variation in manufacturing. For example, the three frequency bands could cover one GHz to three GHz, two and a half GHz to four and a half GHz, and four GHz to six GHz, respectively. In one embodiment, for example, each frequency band may be associated with a four hundred millivolt (mV) range of the control voltage. Accordingly, in this embodiment, the VCO 100 would have a five GHz per Volt gain. In contrast, a traditional ring oscillator based VCO may have a five GHz band from one GHz to six GHz over a four hundred mV range, thus having a twelve and a half GHz per Volt gain. As discussed above, when a VCO has a large gain, any noise in the input signal is increased proportionally, causing more jitter or phase noise.

The bias current supplied from the current bias circuit 130 biases the current generated by the voltage-to-current converter 120. As discussed above, the current bias circuit 130 may have three current levels that could be output corresponding to three frequency bands. By biasing the current generated by the voltage-to-current converter 120, the current input to the current starved differential ring oscillator 140 is increased, increasing the frequency of the oscillating frequency signal output there from. Accordingly, by using the current bias circuit 130 to increase the current received by the current starved differential ring oscillator 140, the bandwidth of the VCO 100 is increased. Therefore, a low gain ring oscillator based VCO which covers relatively narrow frequency bands can be used. The current bias circuit 130 allows the VCO 100 to shift between multiple narrow frequency bands based on the input frequency band select digital code.

While the embodiment described above illustrates a VCO 100 utilizing three frequency bands, the number of frequency bands can vary. When more frequency bands are used, a lower gain ring oscillator based VCO which covers even narrower frequency bands, can be used. By reducing the gain of the VCO 100, the amount of jitter or phase noise in the VCO 100 is also reduced.

Depending upon the device using the VCO 100, a level shifter 150 may be coupled to the output of the current starved differential ring oscillator 140. The level shifter 150 may be used to shift a level of the oscillating signal output by the VCO for use by the device.

Figure 2:
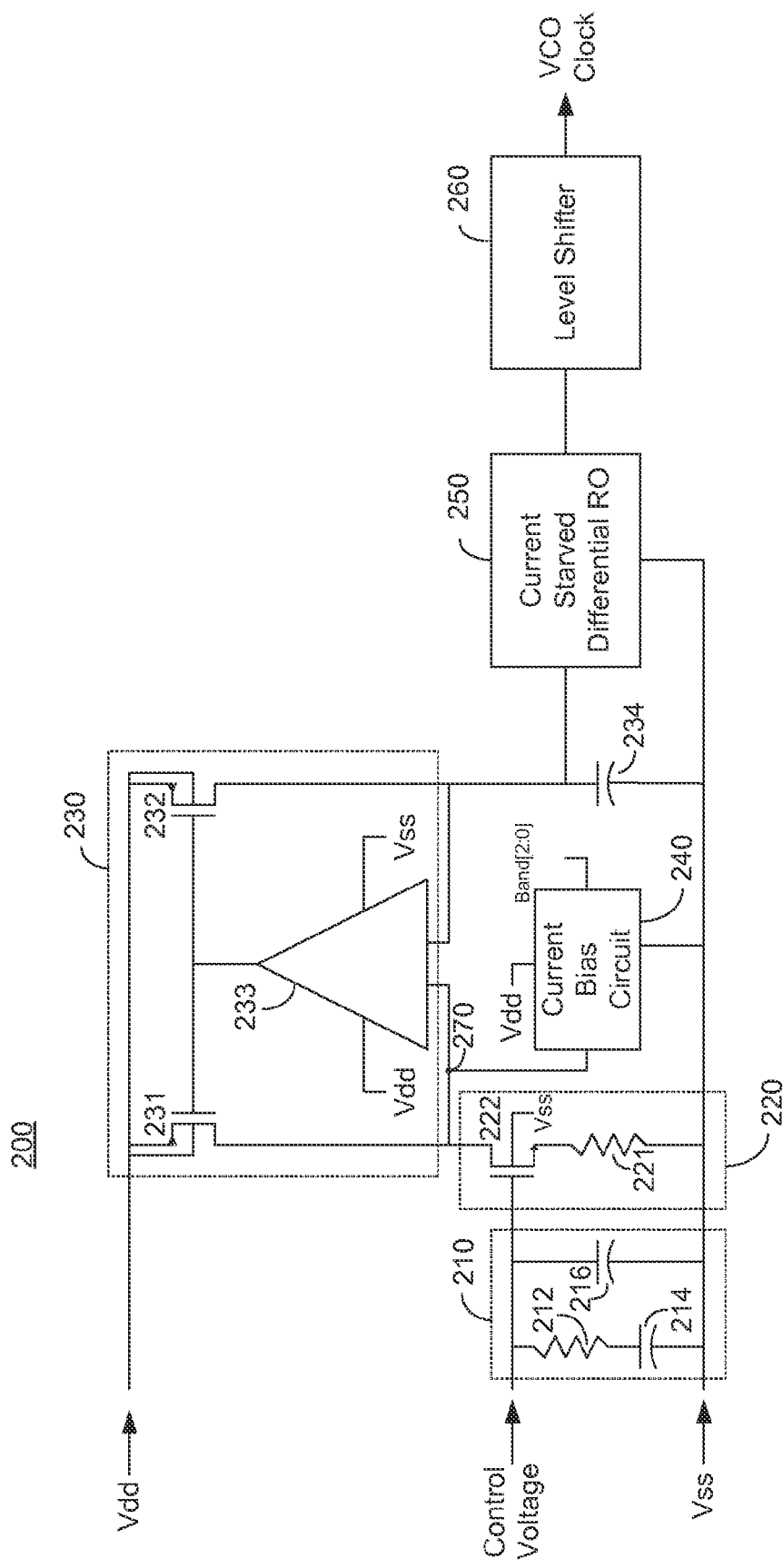
FIG. 2 is a circuit level diagram of an exemplary VCO in accordance with an embodiment.

FIG. 2 is a circuit level diagram of an exemplary VCO 200 in accordance with an embodiment. The VCO 200 includes a loop filter 210 to filter noise from the input control voltage. The loop filter 210 includes a resistor 212 electrically connected in series with a capacitor 214. The series combination of resistor 212 and capacitor 214 are electrically connected in parallel with a capacitor 216. The loop filter 210 illustrated in FIG. 2 is a low pass filter.

The VCO 200 also includes a voltage-to-current converter 220. The voltage-to-current converter 220 illustrated in FIG. 2 includes a resistor 221 and a transistor 222 which convert the voltage output from the loop filter 210 to a current, however, any electronic component that takes a voltage as input and outputs a current may be used. The VCO 200 also includes a current mirror formed by transistors 231 and 232. The current mirror mirrors the current generated by resistor 221 and transistor 222 and supplies the current to a current starved differential ring oscillator 250. Further, a capacitor 234 may be connected between the input of the current starved differential ring oscillator 250 and Vss to filters noise at the output of current mirror. As discussed in further detail below, the current mirror also mirror the current generated by the current bias circuit 240 and applies the biased current to the current starved differential ring oscillator 250.

The value of the resistor 221 determines the amount of gain generated by the voltage-to-current converter 220, hence the amount of gain of VCO 200. By increasing the value of the resistor 221, the gain of the VCO is reduced. By reducing the gain of the VCO 200, the amount of jitter resulting from noise on the input control voltage is reduced. However, by reducing the gain of the VCO 200, the frequency band of the VCO 200 is also reduced. However, as discussed in further detail below, a current bias circuit 240 biases the current generated by the voltage-to-current converter 220, increasing the bandwidth of the VCO 200.

Figure 3:
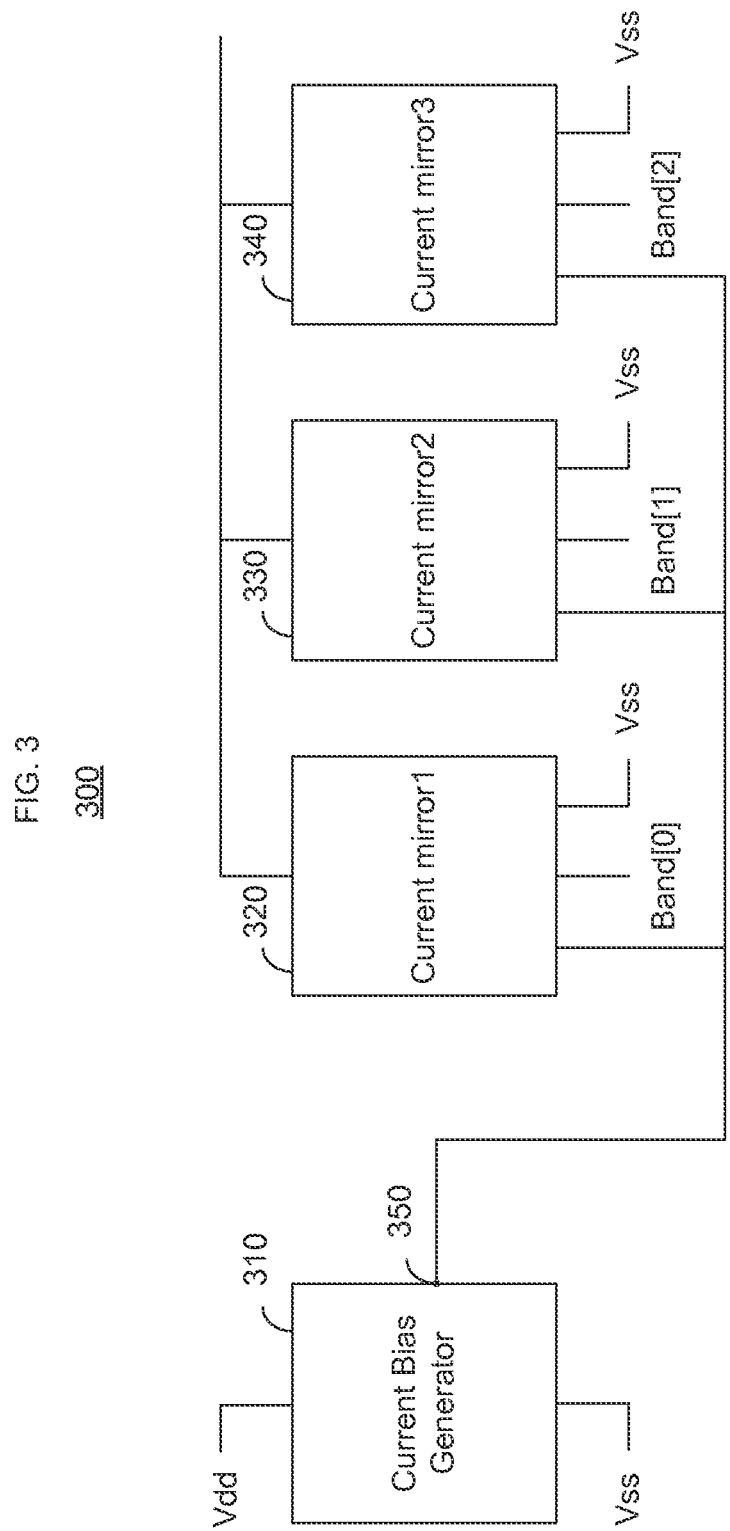
FIG. 3 is a circuit diagram on an exemplary current bias circuit suitable for use in the VCOs illustrated in FIGS. 1 and 2.

FIG. 3 is a circuit diagram of an exemplary current bias circuit 300 suitable for use in the VCOs illustrated in FIGS. 1 and 2. The current bias circuit 300 includes a current bias generator 310. The current bias generator also receives the positive voltage supply Vdd and the negative voltage supply Vss, which, as discussed above, may also be a ground. The output at node 350 of the current bias generator is input to current mirrors 320, 330, and 340, respectively. Each current mirror also receives Band[2:0] signals as shown in FIG. 3.

Returning to FIG. 2, the bias current provided by the current bias circuit 240 is added to the current generated by the voltage-to-current converter at a node 270. In other embodiments, for example, the bias current may be multiplied, divided, subtracted, added, or any combination thereof, with the current generated by the voltage-to-current converter. The current generated by the voltage-to-current converter and biased by the current bias circuit, hereinafter referred to as biased current, is mirrored by the current mirror formed by transistors 231 and 232. An op amp 233 may be used to ensure that the current mirror is properly mirroring the biased current without any error across process and supply voltage variations.

The current starved differential ring oscillator 250 generates an oscillating signal based upon the biased current (i.e., the combination of the output of the voltage-to-current converter 220 current bias generator 240). As discussed above, the VCO 200 may also include a level shifter 260 to shift a level of the oscillating signal output from the current starved differential ring oscillator 250.

Figure 4:
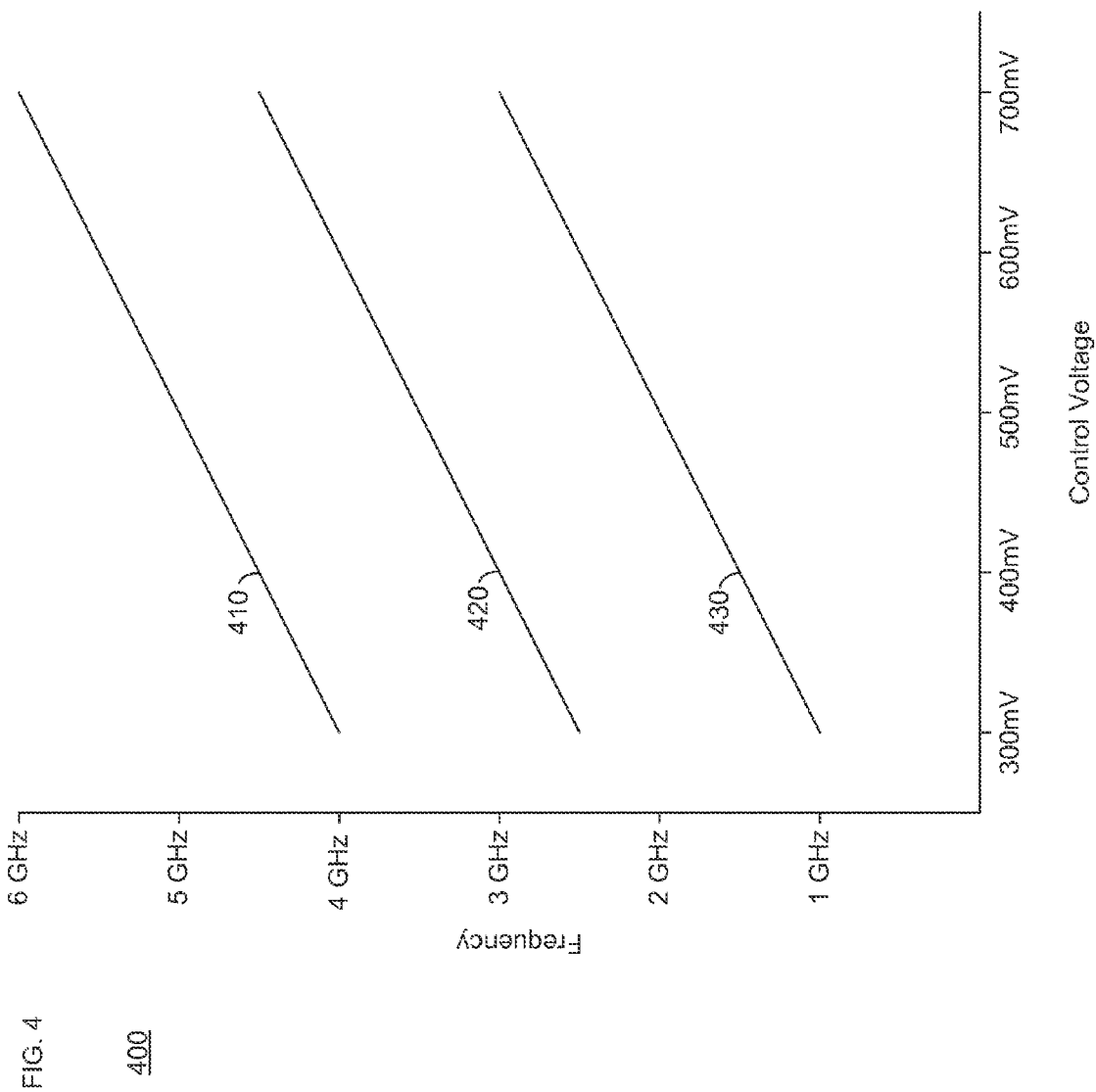
FIG. 4 is a graph illustrating an exemplary output of the VCO illustrated in FIGS. 1 and 2.

FIG. 4 is a graph 400 illustrating an exemplary output of the VCO illustrated in FIGS. 2 and 3. As discussed above, in this embodiment, the VCO 200 is configured to have three potential bias currents. Each of the bias currents cause the VCO 200 to output a signal oscillating at a frequency within one of three frequency bands 410, 420 and 430. As discussed above, the embodiments illustrated in FIG. 3 illustrates a current bias circuit 300 implementing three frequency bands, however, the VCO 200 can be configured to have any number of frequency bands. The control voltage input to the VCO 200 determines where the output frequency within a selected frequency band.

FIG. 5 illustrates a method 500 for generating a voltage controlled oscillating signal using a VCO 200 in accordance with an embodiment. The method begins by receiving a control voltage. (Step 510). The control voltage may then be filtered by a filter 210. (Step 520).

The filtered voltage is then converted to a current using, for example, the voltage-to-current converter 220 illustrated in FIG. 2. (Step 530). Depending on the band selected, the current bias circuit 240 generates bias current. (Step 540).

The current generated by the current bias circuit 240 may then be added to the current generated by the voltage-to-current converter 220. (Step 550). The combined currents may then be fed to a current starved differential ring oscillator to generate an oscillating signal. (Step 560). Further, if the device utilizing the VCO 200 needs an oscillating signal at another level, the oscillating signal may be shifted by a level shifter 260. (Step 570).

The description and examples set forth herein were presented in order to best explain embodiments of the invention and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A voltage controlled oscillator, comprising:
a voltage-to-current converter configured to receive a control voltage corresponding to a desired frequency within one of a plurality of frequency bands and to convert the control voltage to a current;
a current bias circuit coupled to the voltage-to-current converter and configured to receive a digital code corresponding to one of the frequency bands and to bias the current generated by the voltage-to-current converter based upon the digital code;
a current mirror having a plurality of transistors electrically connected to an op amp, the current mirror coupled to the voltage-to-current converter and the current bias circuit to mirror the current provided by the voltage-to-current converter and biased by the current bias circuit; and
a ring oscillator coupled to receive the mirrored current and to output an oscillating signal corresponding to the desired frequency based upon the mirrored current.

2. The ring oscillator based voltage controlled oscillator of claim 1, wherein the current bias circuit generates a predetermined amount of bias current based upon the digital code to place a frequency of the output oscillating signal of the ring oscillator in one of the frequency bands.

3. The ring oscillator based voltage controlled oscillator of claim 2, wherein the current bias circuit comprises means for adding one of a plurality of predetermined currents to the current generated by the voltage-to-current converter based upon the frequency band corresponding to the digital code.

4. The ring oscillator based voltage controlled oscillator of claim 1, further comprising a filter coupled to the voltage-to-current converter and configured to filter noise from the control voltage.

5. The ring oscillator based voltage controlled oscillator of claim 4, wherein the filter is a loop filter.

6. The ring oscillator based voltage controlled oscillator of claim 1, further comprising a level shifter configured to shift a level of the oscillating signal output by the ring oscillator.

7. The ring oscillator based voltage controlled oscillator of claim 1, wherein the ring oscillator is a current starved differential ring oscillator.

8. The ring oscillator based voltage controlled oscillator of claim 2, wherein each frequency band is two gigahertz wide.

9. The ring oscillator based voltage controlled oscillator of claim 1, wherein an output of the op amp of the current mirror is electrically connected to a gate of each of the plurality of transistors of the current mirror.

10. The ring oscillator based voltage control controlled oscillator of claim 1, wherein the each frequency band overlaps at least one of another of the frequency bands.

11. A processor, comprising:
a loop filter configured to receive a control voltage corresponding to a desired frequency within one of a plurality of frequency bands and to filter noise from the control voltage;
a voltage-to-current converter coupled to the loop filter and configured to receive the filtered control voltage and to convert the filtered control voltage to a current;
a current bias circuit coupled to the voltage-to-current converter and configured to receive a digital code corresponding to one of the frequency bands and to bias the current generated by the voltage-to-current converter based upon the digital code;

a current mirror having a plurality of transistors electrically connected to an op amp, the current mirror coupled to the voltage-to-current converter and the current bias circuit to mirror the current provided by the voltage-to-current converter and biased by the current bias circuit; and a current starved differential ring oscillator coupled to the current mirror and configured to receive the mirrored current and to generate an oscillating signal corresponding to the desired frequency based upon the mirrored current.

12. The processor of claim 11, wherein the current bias circuit adds one of a plurality of predetermined currents to the current generated by the voltage-to-current converter based upon the frequency band corresponding to the digital code.

13. The processor of claim 11, further comprising a level shifter coupled to the current starved differential ring oscillator and configured to shift a level of the oscillating signal output by the current starved differential ring oscillator.

14. The processor of claim 11, wherein the current starved ring oscillator operates in multiple frequency bands and each frequency band is approximately two gigahertz wide.

15. The processor of claim 11, wherein an output of the op amp of the current mirror is electrically connected to a gate of each of the plurality of transistors of the current mirror.

16. The processor of claim 11, wherein the each frequency band overlaps at least one of another of the frequency bands.

* * * * *